United States Patent
Nakamura et al.

(10) Patent No.: US 8,519,989 B2
(45) Date of Patent: Aug. 27, 2013

(54) PLASMA DISPLAY DEVICE USING A PLURALITY OF METAL FITTINGS FOR REDUCING IMPEDANCE

(75) Inventors: Kazuyoshi Nakamura, Osaka (JP); Yoshihiro Matsui, Osaka (JP)

(73) Assignee: Panasonic Corporation, Osaka (JP)

( * ) Notice: Subject to any disclaimer, the term of this patent is extended or adjusted under 35 U.S.C. 154(b) by 291 days.

(21) Appl. No.: 12/597,195

(22) PCT Filed: Feb. 6, 2009

(86) PCT No.: PCT/JP2009/000456
§ 371 (c)(1),
(2), (4) Date: Oct. 23, 2009

(87) PCT Pub. No.: WO2009/098889
PCT Pub. Date: Aug. 13, 2009

(65) Prior Publication Data
US 2010/0141615 A1 Jun. 10, 2010

(30) Foreign Application Priority Data
Feb. 6, 2008 (JP) .................. 2008-026169

(51) Int. Cl.
G09G 3/28 (2013.01)
G09G 5/00 (2006.01)
G06F 3/038 (2013.01)
(52) U.S. Cl.
USPC ............................................ 345/204; 345/60
(58) Field of Classification Search
USPC ....................................................... 345/204
See application file for complete search history.

(56) References Cited

U.S. PATENT DOCUMENTS

| 6,429,547 | B1 * | 8/2002 | Muroi et al. ............... 307/66 |
| 6,722,919 | B2 * | 4/2004 | Lin ............................ 439/569 |
| 7,321,345 | B2 | 1/2008 | Choi et al. |
| 2002/0047586 | A1 * | 4/2002 | Itoh et al. ................ 315/169.4 |
| 2004/0233132 | A1 * | 11/2004 | Choi et al. ................. 345/60 |
| 2006/0061944 | A1 | 3/2006 | Nakatani et al. |
| 2008/0297443 | A1 * | 12/2008 | Arima et al. ............... 345/60 |

FOREIGN PATENT DOCUMENTS

| JP | 1-118474 | 8/1989 |
| JP | 2-87382 | 7/1990 |
| JP | 02-087382 U | 7/1990 |
| JP | 08-321337 | 12/1996 |
| JP | 08-321337 A | 12/1996 |

(Continued)

OTHER PUBLICATIONS

International Search Report for International Application No. PCT/JP2009/000456, Mar. 10, 2009, Panasonic Corporation.

*Primary Examiner* — Alexander S Beck
*Assistant Examiner* — Karin Kiyabu
(74) *Attorney, Agent, or Firm* — RatnerPrestia

(57) ABSTRACT

In a plasma display device, the scan electrode drive circuit is mounted at least on a first circuit board generating a sustain pulse and a second circuit board outputting a scan pulse to the scan electrodes. The first circuit board includes a plurality of first metal fittings, each having a screw hole, as an output terminal. The second circuit board includes a plurality of second metal fittings, each having a through-hole, as an input terminal. The first circuit board and the second circuit board are connected to each other by inserting and screwing screws into the screw holes of the first metal fittings via the through-holes of the second metal fittings.

8 Claims, 10 Drawing Sheets

(56) References Cited

FOREIGN PATENT DOCUMENTS

| | | | |
|---|---|---|---|
| JP | 08321337 A * | 12/1996 | |
| JP | 2000-236185 A | 8/2000 | |
| JP | 2002-032056 A | 1/2002 | |
| JP | 2003-015540 A | 1/2003 | |
| JP | 2004-347622 A | 12/2004 | |
| JP | 2004-348138 A | 12/2004 | |
| JP | 2005-017628 A | 1/2005 | |
| JP | 2006-003810 A | 1/2006 | |
| JP | 2006-065119 A | 3/2006 | |
| JP | 2006065119 A * | 3/2006 | |
| JP | 2007-225987 A | 9/2007 | |
| JP | 2009-521265 | 11/2010 | |
| KR | 10-2009-7025618 | 3/2011 | |
| WO | WO 2008/010288 A1 | 1/2008 | |

* cited by examiner

PLASMA DISPLAY DEVICE USING A PLURALITY OF METAL FITTINGS FOR REDUCING IMPEDANCE

This Application is a U.S. National Phase Application of PCT International Application PCT/JP2009/000456.

TECHNICAL FIELD

The present invention relates to a plasma display device, which is an image display device using a plasma display panel.

BACKGROUND ART

Plasma display devices using a plasma display panel (hereinafter abbreviated as "panel"), which is one of well-known image display panels, are becoming the mainstream of large-screen image display devices. This is because of their advantageous properties such as a wide angle of vision, easy upsizing, self-luminousness, and high image display quality.

The panel has a large number of discharge cells formed between a front substrate and a rear substrate facing each other. The front substrate includes a front glass substrate provided thereon with parallel-arranged display electrode pairs each consisting of a scan electrode and a sustain electrode. The rear substrate includes a rear glass substrate provided thereon with parallel-arranged data electrodes, barrier ribs, and a phosphor layer. The front and rear substrates are oppositely disposed so as to make the display electrode pairs and the data electrodes three-dimensionally intersect with each other, and to seal a discharge space formed between these substrates. The sealed discharge space is filled with a discharge gas. The discharge cells are formed in the areas where the display electrode pairs and the data electrodes intersect with each other.

A plasma display device displays images by applying a sustain pulse to so as to enable these discharge cells to discharge and to emit light.

To make each discharge cell stably generate a sustain discharge, it is necessary to apply the display electrode pairs with a sustain pulse having a rise time of 1 μsec or less and an amplitude of one hundred and several tens of volts. When the panel has a display screen of, for example, 50 inches, a large current over several tens of amperes flows instantaneously. Therefore, it is essential for the generation of a stable discharge to uniquely arrange and wire the driver circuits so as to reduce the impedance of current paths between the driver circuits and the display electrode pairs. This prevents superimposition of ringing or the like on the sustain pulse or voltage drop due to the large current.

Patent Document 1 shows a plasma display device having driver circuits that are uniquely arranged and wired so as to reduce parasitic inductances, and hence, the ringing in the drive voltage waveforms of the panel.

Patent Document 2 shows a method for securing the electrical connection and fixation between two parallel circuit boards.

However, as the panel increases in size, the current for charging and discharging the panel capacitance and also the current due to discharge increase in proportion to the square of the display screen size. This causes even a small impedance of the current paths to deteriorate image display quality. Furthermore, there is a growing demand for higher image display quality, which does not allow even a slight unevenness of luminance, color, or the like due to the ringing or the like in the drive voltage waveforms.

Patent Document 1: Japanese Patent Unexamined Publication No. 2004-347622
Patent Document 2: Japanese Patent Unexamined Publication No. 2000-236185

SUMMARY OF THE INVENTION

The plasma display device of the present invention includes a panel and a scan electrode drive circuit. The panel includes a plurality of discharge cells, each of the discharge cell having a scan electrode, a sustain electrode, and a data electrode. The scan electrode drive circuit drives the scan electrodes in one field composed of a plurality of subfields, each of the subfields including an address period to perform an address operation in which the scan electrodes are applied with a scan pulse and the data electrodes are applied with an address pulse; and a sustain period to apply the scan electrodes and the sustain electrodes alternately with a sustain pulse so as to enable the discharge cells that have performed the address operation in the address period to emit light.

The scan electrode drive circuit of the plasma display device is mounted at least on a first circuit board generating a sustain pulse and a second circuit board outputting a scan pulse to the scan electrodes. The first circuit board includes a plurality of first metal fittings, each having a screw hole, as an output terminal. The second circuit board includes a plurality of second metal fittings, each having a through-hole, as an input terminal. To mount the scan electrode drive circuit, the first circuit board and the second circuit board are connected to each other by inserting and screwing screws into the screw hole of the first metal fittings via the through-holes of the second metal fittings.

With this structure, the plasma display device can produce high quality images by providing the display electrode pairs with desired drive voltage waveforms even when the panel is large.

The first metal fittings of the plasma display device of the present invention have the form of a U-shaped gutter placed upside down to be shaped like a table. The first metal fittings each include the screw hole at a center of a top, and a plurality of leg pieces passing through the first circuit board, the leg pieces being formed on the sides that opposite to the top and are in contact with the first circuit board. When the leg pieces are made to pass through the first circuit board, it is preferable that the leg pieces are arranged to have the sides, which are opposite to the top and are in contact with the first circuit board, on both sides thereof. This structure prevents the first metal fittings from tilting or being uplifted.

Figure 1:
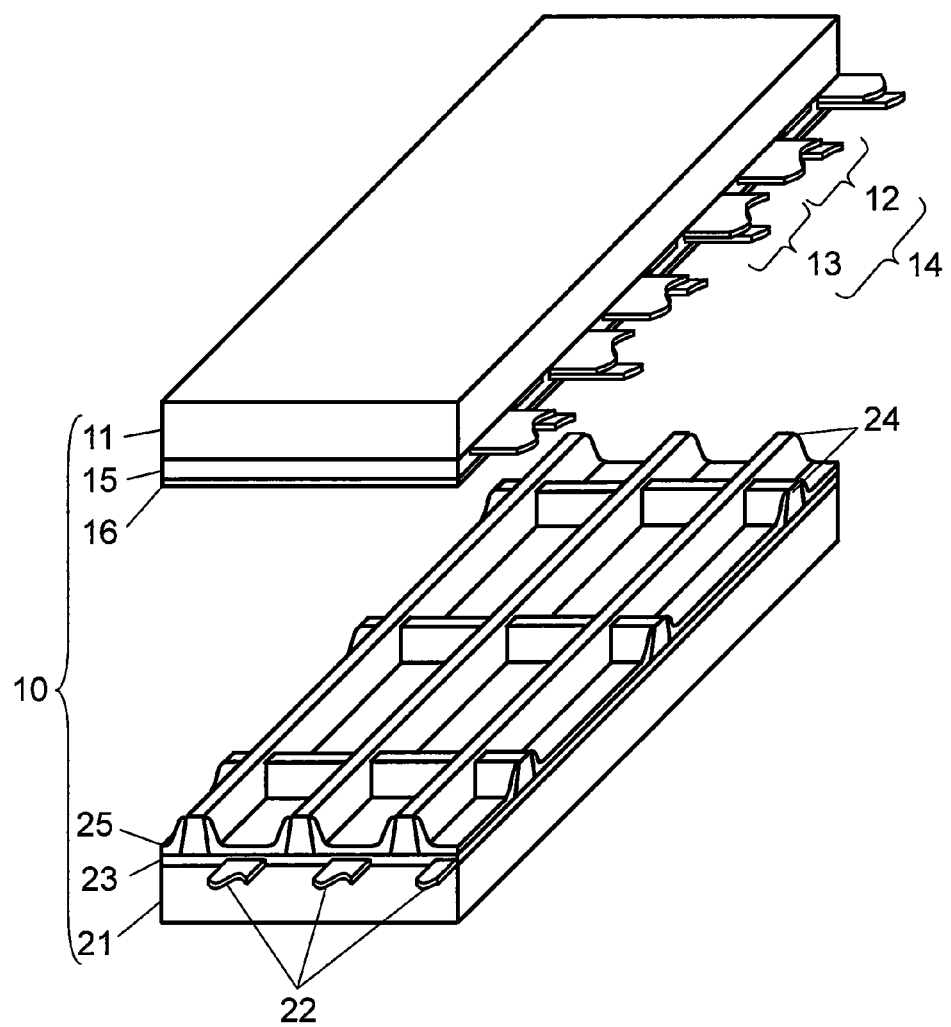
FIG. 1 is an exploded perspective view of a panel used in a plasma display device according to the embodiment of the present invention.

REFERENCE MARKS IN THE DRAWINGS 10 panel (plasma display panel)
11 front substrate
12 scan electrode
13 sustain electrode
14 display electrode pair
15 dielectric layer
16 protective layer
21 rear substrate
22 data electrodes
23 dielectric layer
24 barrier ribs
31 image signal processing circuit
32 data electrode drive circuit
33 scan electrode drive circuit
34 sustain electrode drive circuit
35 timing generating circuit
41, 45 sustain pulse generator
42 initializing waveform generator
43 scan pulse generator
51 first circuit board
52, 53 second circuit board
56 output terminal foil
57 input terminal foil
58 input terminal foil
61 chassis
62 thermally conductive sheet
63 circuit block
65 front frame
66 backcover
70 first metal fitting
71 top
72 screw hole
73, 74 side (opposite to top 71)
75 leg piece
80 second metal fitting
81 through-hole (of a second metal fitting)
82 connection piece
86 screw
91, 93 through-hole (of a circuit board)
92, 94 solder
100 plasma display device
Cp interelectrode capacitance
P1 output terminal
P2 input terminal
P3 input terminal
D1 to Dm data electrodes
SC1 to SCn scan electrode
SU1 to SUn sustain electrode

DETAILED DESCRIPTION OF PREFERRED EMBODIMENT

A plasma display device according to an embodiment of the present invention will be described as follows with reference to drawings.

Embodiment

FIG. 1 is an exploded perspective view of panel 10 used in a plasma display device according to the embodiment of the present invention. Panel 10 includes front substrate 11 and rear substrate 21 which are made of glass. Front substrate 11 is provided thereon with display electrode pairs 14 each consisting of scan electrode 12 and sustain electrode 13, display electrode pairs 14 being coated with dielectric layer 15, which is further coated with protective layer 16. Rear substrate 21 is provided thereon with data electrodes 22, dielectric layer 23, and mesh barrier ribs 24. Rear substrate 21 further includes phosphor layers 25 of red, green, and blue formed on the side surfaces of barrier ribs 24 and on dielectric layer 23.

Front and rear substrates 11 and 21 are oppositely disposed so that display electrode pairs 14 and data electrodes 22 intersect with each other with a small discharge space therebetween. Front and rear substrates 11 and 21 are sealed at their peripheries with a sealing member such as a glass frit so as to form a discharge space. The discharge space is filled with a discharge gas, which is, for example, a mixture gas of neon and xenon. The discharge space is partitioned into a plurality of sections by barrier ribs 24. The discharge space includes discharge cells in the areas where display electrode pairs 14 and data electrodes 22 intersect with each other. The discharge cells discharge and emit light so that images can be displayed. Thus, panel 10 includes a plurality of discharge cells having scan electrodes 12, sustain electrodes 13, and data electrodes 22.

The structure of panel 10 is not limited to the one described above. For example, the barrier ribs may be formed in a stripe pattern.

Figure 2:
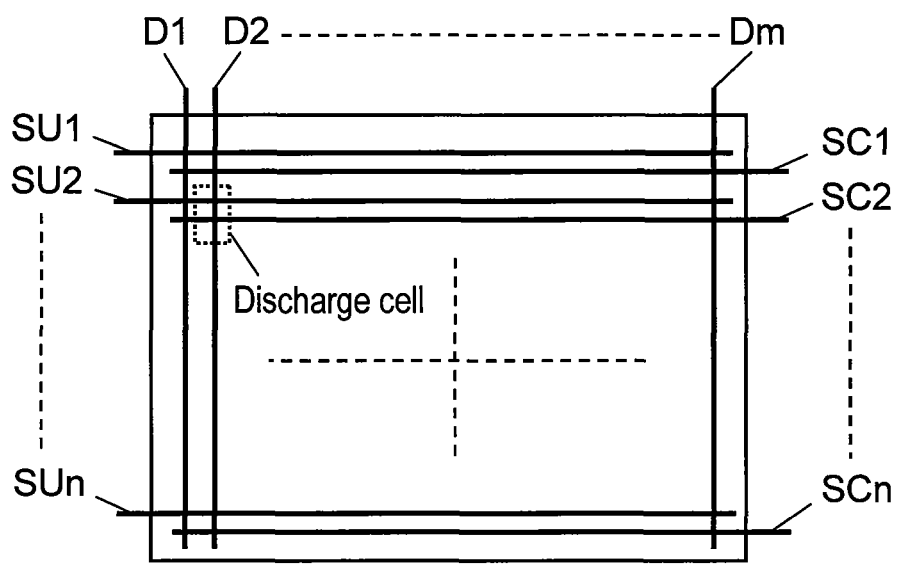
FIG. 2 shows an electrode array of the panel.

FIG. 2 shows an electrode array of panel 10 according to the embodiment of the present invention. Panel 10 includes n scan electrodes SC1 to SCn (corresponding to scan electrodes 12 of FIG. 1) and n sustain electrodes SU1 to SUn (corresponding to sustain electrodes 13 of FIG. 1) extending in the row direction. Panel 10 further includes m data electrodes D1 to Dm (corresponding to data electrodes 22 of FIG. 1) extending in the column direction. In the embodiment, n=1080 and m=5760. Each discharge cell is formed in the area where one pair of scan electrode SCi (i=1 to n) and sustain electrode SUi intersects with one data electrode Dj (j=1 to m). As a result, the discharge space includes m×n discharge cells.

Since scan electrodes SCi and sustain electrodes SUi are arranged in parallel pairs as shown in FIGS. 1 and 2, there is a large interelectrode capacitance Cp between scan electrodes SC1 to SCn and sustain electrodes SU1 to SUn.

The following is a description of a method for driving panel 10. In the embodiment, panel 10 is driven by a so-called subfield method in which gradation is displayed based on an image signal. In the subfield method, one field is divided into a plurality of subfields each including at least an address period and a sustain period, and each discharge cell is controlled to emit or not to emit light in each subfield so as to achieve gradation display.

Figure 3:
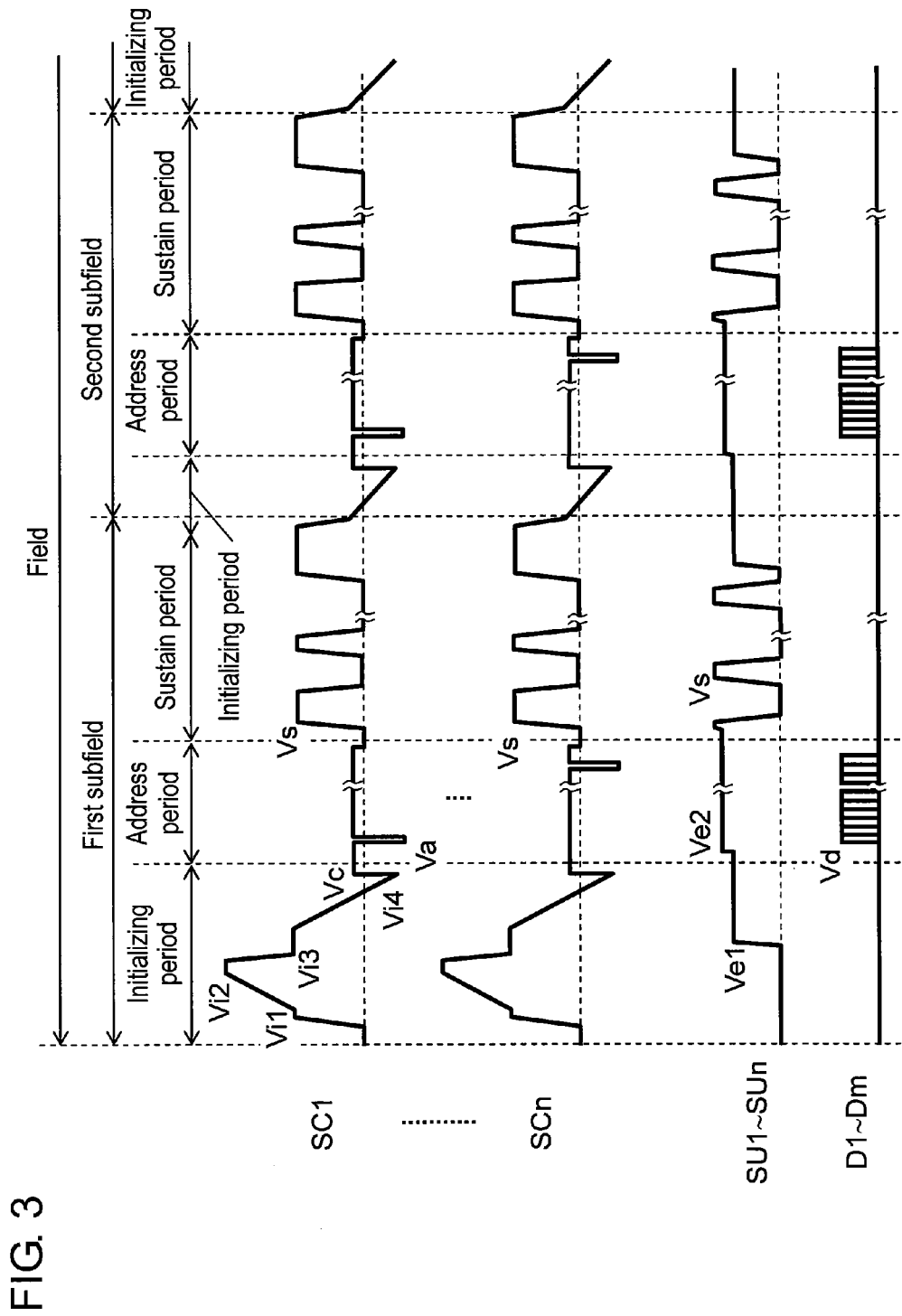
FIG. 3 shows waveforms of drive voltages to be applied to the electrodes of the panel.

FIG. 3 shows waveforms of drive voltages to be applied to the electrodes of panel 10 of the embodiment. Although FIG. 3 shows drive voltage waveforms in only two subfields, the other subfields also have nearly the same voltage waveforms.

In an initializing period of a subfield, data electrodes D1 to Dm and sustain electrodes SU1 to SUn are applied with 0V, and scan electrodes SC1 to SCn are subjected to a ramp voltage gradually rising from voltage Vi1 to voltage Vi2. Later, sustain electrodes SU1 to SUn are applied with voltage Ve1, and scan electrodes SC1 to SCn are subjected to a ramp voltage gradually falling from voltage Vi3 to voltage Vi4. As a result, a weak initialization discharge is generated in all the discharge cells so as to form wall charges necessary for the subsequent address operation on the electrodes. The operation in an initializing period may alternatively be to subject scan electrodes SC1 to SCn to the gradually falling ramp voltage as shown in the initializing period of the second subfield of FIG. 3.

In the address period, sustain electrodes SU1 to SUn are applied with voltage Ve2, scan electrodes SC1 to SCn are applied with voltage Vc, and data electrodes D1 to Dm are applied with 0V.

Scan electrode SC1 in the first row, which performs an address operation, is applied with scan pulse Va, and data electrodes Dk (k=1 to m) corresponding to the discharge cells to be illuminated is applied with address pulse Vd. As a result, the discharge cells in the first row applied with scan pulse Va and address pulse Vd at the same time generate an address discharge and perform an address operation so as to accumulate wall charges on scan electrode SC1 and sustain electrode SU1.

The above-described address operation is repeated in the discharge cells in all the rows so as to generate an address discharge selectively in the discharge cells to be illuminated, thereby forming wall charges.

In the sustain period, sustain electrodes SU1 to SUn are applied with 0V, and scan electrodes SC1 to SCn are applied with sustain pulse Vs. As a result, the discharge cells that have performed an address discharge generate a sustain discharge and emit light. Then, scan electrodes SC1 to SCn are applied with 0V, and sustain electrodes SU1 to SUn are applied with sustain pulse Vs. As a result, the discharge cells that have generated a sustain discharge again generate a sustain discharge and emit light. In the same manner, sustain pulses whose number corresponds to the luminance weight are applied alternately to scan electrodes SC1 to SCn and sustain electrodes SU1 to SUn. Thus, the discharge cells which have performed an address operation in the address period emit light with a luminance corresponding to the luminance weight. Then, scan electrodes SC1 to SCn are applied with sustain pulse Vs, and sustain electrodes SU1 to SUn are applied with voltage Ve1 so as to erase the wall charges, thereby completing the sustain period.

The aforementioned sustain discharge causes a discharging current corresponding to the number of the discharge cells which have generated a discharge. When, for example, all the discharge cells generate discharge, an extremely large current over several tens of amperes flows instantaneously. Nevertheless, in the embodiment, a desired sustain pulse can be applied to the display electrode pairs without a large voltage drop. This is achieved, as will be described later in detail, by uniquely connecting the circuit boards so as to minimize the impedance of the current paths from the sustain pulse generator to each scan electrode SCi.

The operation in the subsequent subfield is not described because it is nearly the same as in the first subfield.

The voltage values to be applied to the electrodes in the embodiment are, for example: voltages Vi1 and Vi3=voltage Vs=200V; voltage Vi2=440V; voltage Vi4=−80V; voltage Va=−85V; voltage Ve1=150V; and voltage Ve2=155V. These voltage values are one example, and can be changed depending on the properties of the panel or the specification of the plasma display device.

In the subsequent subfield, the same operation as in the aforementioned subfield is repeated to make the discharge cells emit light for the display of images.

Figure 4:
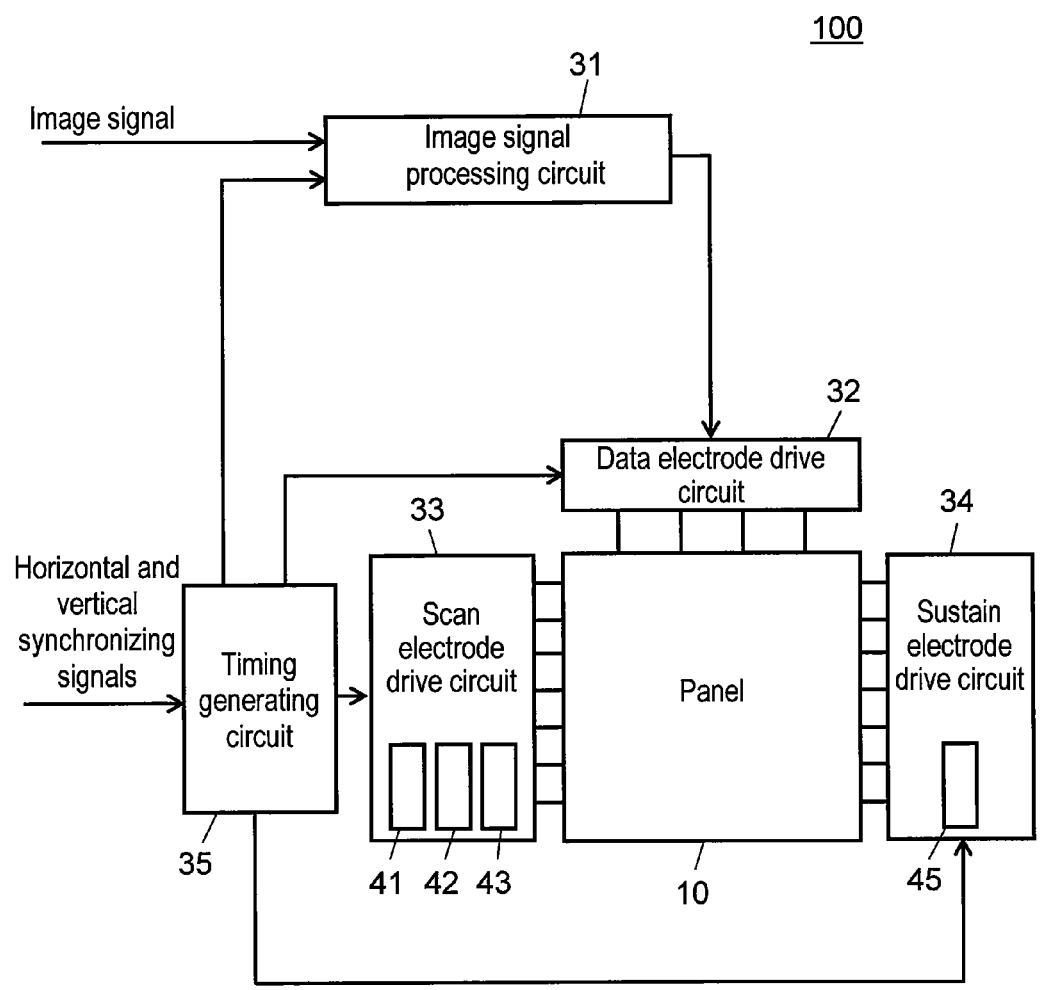
FIG. 4 is a circuit block diagram of the plasma display device according to the embodiment of the present invention.

FIG. 4 is a circuit block diagram of plasma display device 100 according to the embodiment of the present invention. Plasma display device 100 includes panel 10, image signal processing circuit 31, data electrode drive circuit 32, scan electrode drive circuit 33, sustain electrode drive circuit 34, timing generating circuit 35, and a power supply circuit (not shown) for supplying electric power to the circuit blocks.

Image signal processing circuit 31 converts a received image signal into image data indicating emission or non-emission of light in each subfield. Data electrode drive circuit 32 converts the image data in each subfield into signals corresponding to data electrodes D1 to Dm so as to drive data electrodes D1 to Dm. Timing generating circuit 35 generates various timing signals for controlling the operations of the circuit blocks, based on horizontal and vertical synchronizing signals, and supplies the timing signals to the circuit blocks. Scan electrode drive circuit 33 includes sustain pulse generator 41, initializing waveform generator 42, and scan pulse generator 43. Sustain pulse generator 41 generates a sustain pulse in a sustain period. Initializing waveform generator 42 generates a ramp waveform voltage in an initializing period. Scan pulse generator 43 generates a scan pulse in an address period. Scan electrode drive circuit 33 then drives scan electrodes SC1 to SCn based on the timing signals. Sustain electrode drive circuit 34 includes sustain pulse generator 45 for generating a sustain pulse in a sustain period. Sustain electrode drive circuit 34 then drives sustain electrodes SU1 to SUn based on the timing signals.

Figure 5:
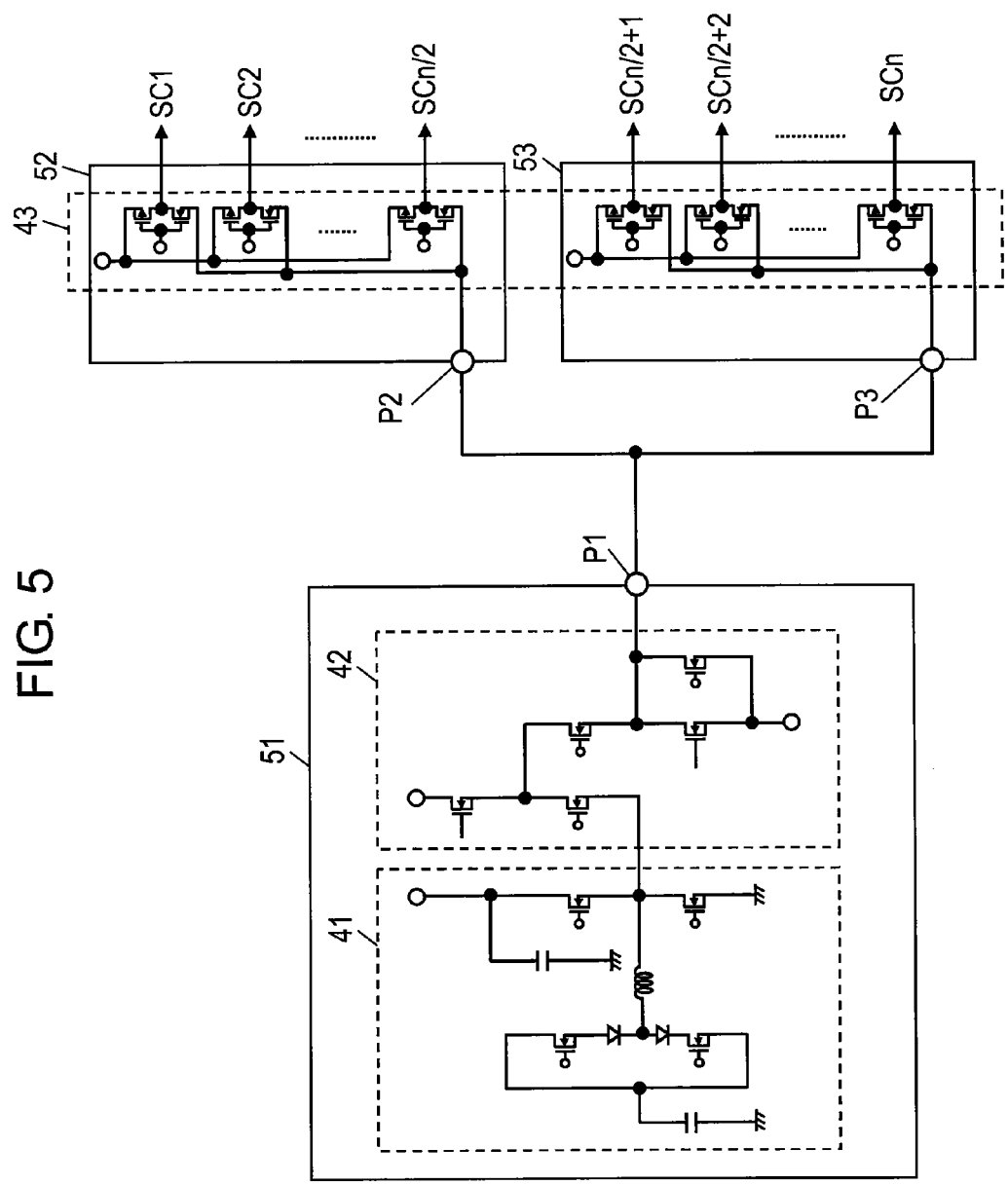
FIG. 5 is a circuit block diagram of a scan electrode drive circuit mounted on the circuit boards of the plasma display device.

These driver circuits are mounted on a circuit board, which is usually a square printed-circuit board having a side of 50 cm or so at most. Therefore, each of data electrode drive circuit 32, scan electrode drive circuit 33, and sustain electrode drive circuit 34 are mounted on a plurality of printed-circuit boards. FIG. 5 is a circuit block diagram of scan electrode drive circuit 33 on a plurality of circuit boards of plasma display device 100 of the embodiment. In FIG. 5, scan electrode drive circuit 33 is mounted on one first circuit board 51 and two second circuit boards 52, 53 so as to drive the 50 inch panel.

First circuit board 51 is mounted with sustain pulse generator 41 and initializing waveform generator 42. Second circuit board 52 is mounted with scan pulse generator 43 corresponding to scan electrodes SC1 to SCn/2. Second circuit board 53 is mounted with scan pulse generator 43 corresponding to scan electrodes SCn/2+1 to SCn. The sustain pulse generated in sustain pulse generator 41 is transmitted from output terminal P1 of first circuit board 51 to input terminal P2 of second circuit board 52, and is applied to scan electrodes SC1 to SCn/2 via scan pulse generator 43 on second circuit board 52. Similarly, the sustain pulse generated in sustain pulse generator 41 is transmitted from output terminal P1 of first circuit board 51 to input terminal P3 of second circuit board 53, and is applied to scan electrodes SCn/2+1 to SCn via scan pulse generator 43 on second circuit board 53.

Figure 6:
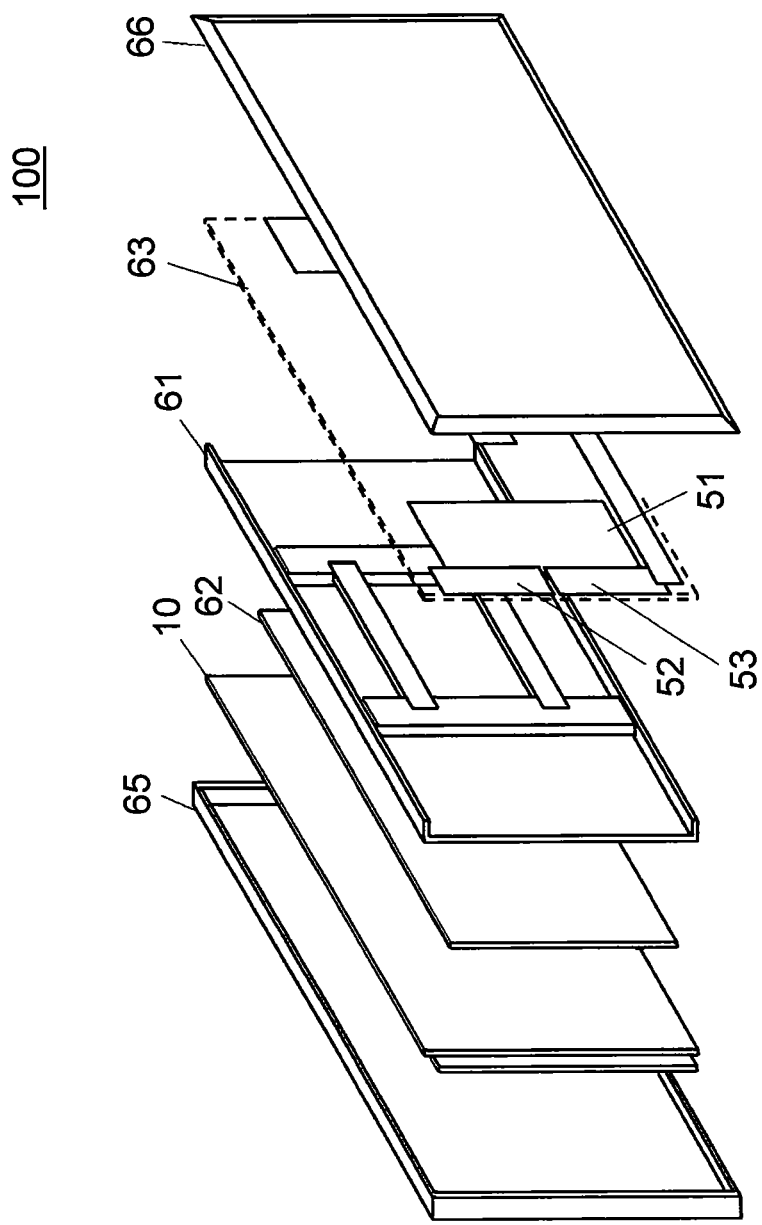
FIG. 6 is an exploded perspective view of the plasma display device.

FIG. 6 is an exploded perspective view of plasma display device 100 of the embodiment. Plasma display device 100 includes panel 10, chassis 61, thermally conductive sheet 62, circuit block 63, front frame 65, and backcover 66. Chassis 61 holds panel 10. Thermally conductive sheet 62 transmits heat generated in panel 10 to chassis 61, and serves to join panel 10 and chassis 61 together. Circuit block 63 includes circuits for driving panel 10, such as the power supply circuit, scan electrode drive circuit 33, sustain electrode drive circuit 34, and timing generating circuit 35. Front frame 65 and backcover 66 hold these components therebetween. In FIG. 6, circuit block 63 shows first circuit board 51 and second circuit boards 52, 53 on which scan electrode drive circuit 33 is mounted.

Figure 7:
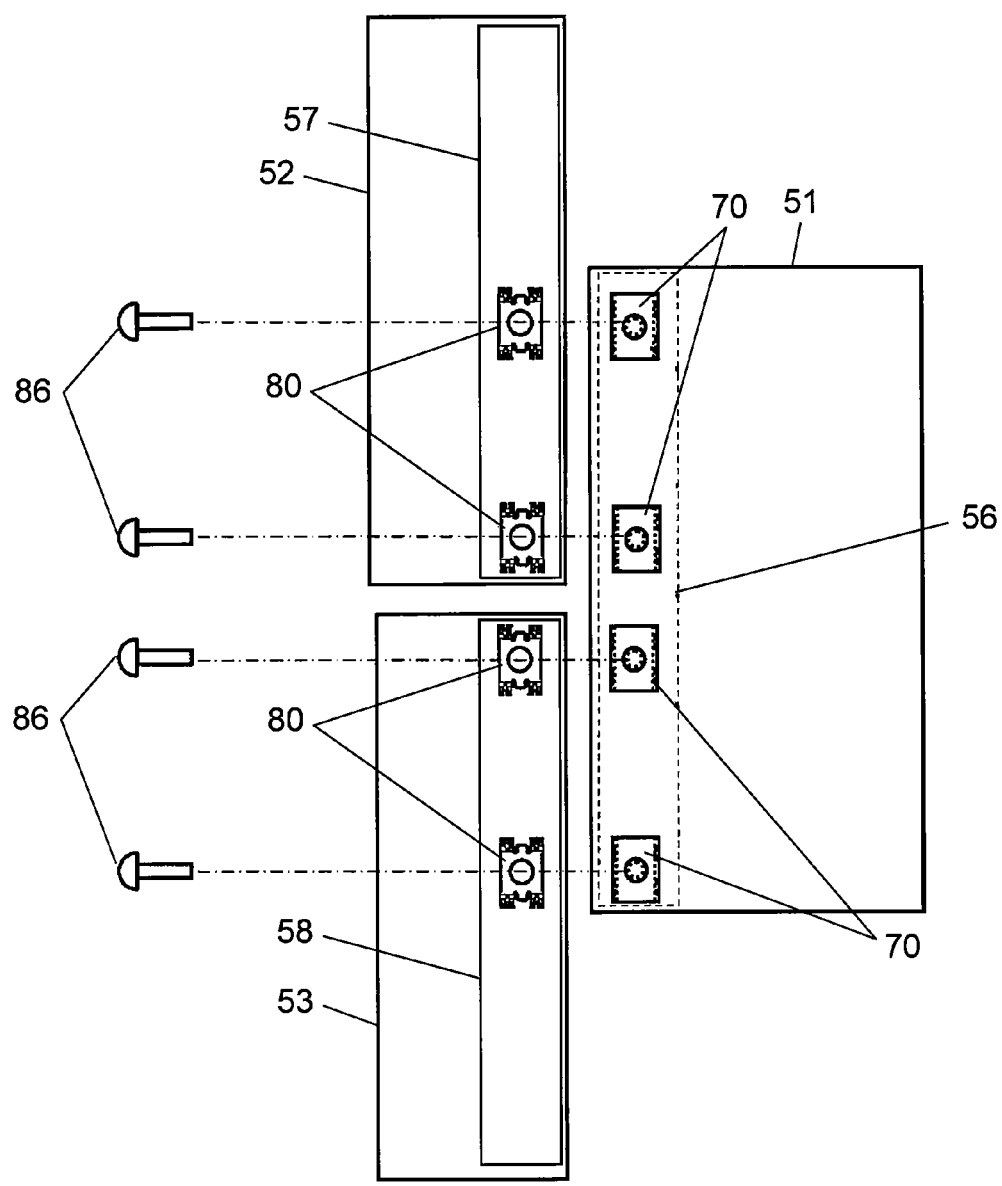
FIG. 7 is a schematic developed view showing a method for connecting a first circuit board and second circuit boards of the plasma display device.

FIG. 7 is a schematic developed view showing a method for connecting first circuit board 51 and second circuit boards 52, 53 of plasma display device 100. First circuit board 51 includes as output terminal P1 two first metal fittings 70 each having a screw hole so as to be connected to second circuit board 52. First metal fittings 70 are soldered to output terminal foil 56 by inserting their leg pieces into the through-holes of first circuit board 51. As shown in the broken lines in FIG. 7, output terminal foil 56 is formed on the side of first circuit board 51 that does not face second circuit board 52. Second circuit board 52 has through-holes for receiving screws in the positions corresponding to two first metal fittings 70. Second circuit board 52 includes as input terminal P2 second metal fittings 80 each having a through-hole. Second metal fittings 80 are provided in the positions corresponding to the through-holes of second circuit board 52. Second metal fittings 80 are soldered to input terminal foil 57, which is formed on the side of second circuit board 52 that does not face first circuit board 51.

Second circuit board 52 is laid over first circuit board 51 in such a manner that first and second metal fittings 70 and 80 overlap each other. Then, screws 86 are inserted and screwed into the screw holes of first metal fittings 70 through the through-holes of second metal fittings 80, thereby connecting first and second circuit boards 51 and 52.

First circuit board 51 includes as output terminal P1 two more first metal fittings 70 each having a screw hole so as to be connected to second circuit board 53. Second circuit board 53 includes as input terminal P3 two second metal fittings 80 each having a through-hole. Second metal fittings 80 are soldered to input terminal foil 58. Similar to input terminal foil 58 is formed on the side of second circuit board 53 that does not face first circuit board 51 as shown in the solid lines in FIG. 7. Second circuit board 53 is laid over first circuit board 51, and screws 86 are inserted and screwed into the screw holes of first metal fittings 70 through the through-holes of second metal fittings 80, thereby connecting first and second circuit boards 51 and 53.

Thus, the plasma display device of the embodiment includes first metal fittings 70 on first circuit board 51 and second metal fittings 80 on second circuit boards 52 and 53. The screwing of first and second metal fittings 70 and 80 reduces the current path impedance, thereby suppressing a decrease in image display quality, such as unevenness of luminance, color, and the like. This effect is increased when screws are screwed in a plurality of positions of the circuit boards. First circuit board 51 has four first metal fittings 70 and second circuit boards 52 and 53 each have two second metal fittings 80 in the embodiment; however, the numbers of these metal fittings are not limited as long as they are more than one. For example, first circuit board 51 can have six or more first metal fittings 70 and second circuit boards 52 and 53 can each have three or more second metal fittings 80.

In the step of fixing a plurality of first metal fittings 70 on first circuit board 51 in an automatic soldering bath, these fittings can be fixed in an uplifted state by the vibration of a conveyer or the buoyancy force during soldering. This can cause improper connection or contact failure between first circuit board 51 and second circuit boards 52, 53, thereby increasing the current path impedance and possibly causing a decrease in image display quality.

To avoid this, first metal fittings 70 of the embodiment are uniquely shaped so as not to be uplifted and to be attached in parallel to first circuit board 51.

Figure 8A:
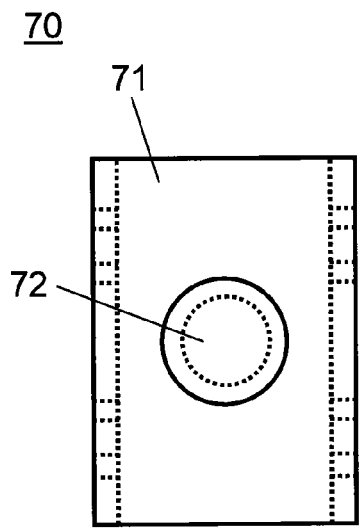
FIG. 8A is a plan view of a first metal fitting used in the plasma display device.
Figure 8B:
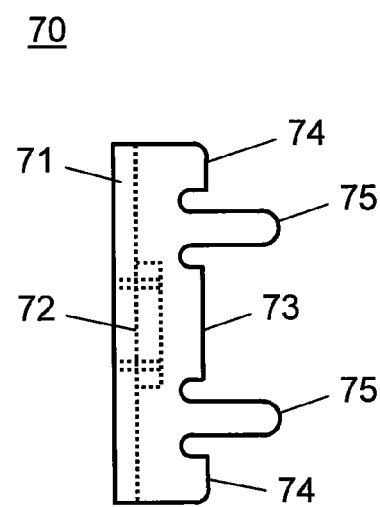
FIG. 8B is a side view of the first metal fitting.
Figure 8C:
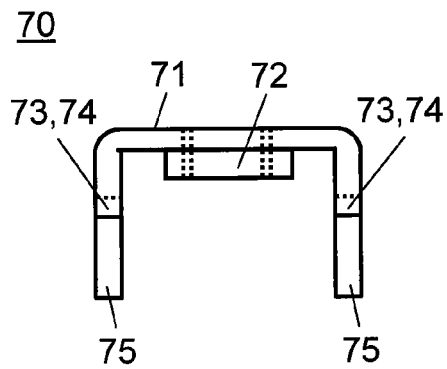
FIG. 8C is a front view of the first metal fitting.

FIGS. 8A, 8B, and 8C are a plan view, a side view, and a front view, respectively, of first metal fittings 70 used in plasma display device 100. First metal fittings 70 have the form of a U-shaped gutter placed upside down to be shaped like a table and each includes top 71 having screw hole 72 at its center. First metal fittings 70 also each include four leg pieces 75 passing through first circuit board 51. Leg pieces 75 are formed on sides 73 and 74 which are opposite to top 71 and are in contact with first circuit board 51. Thus, leg pieces 75, when made to pass through first circuit board 51, are arranged to have both sides thereof sides 73 and 74, which are opposite to top 71 and are in contact with first circuit board 51.

In the step of fixing a plurality of first metal fittings 70 on first circuit board 51 in the automatic soldering bath, first of all, four leg pieces 75 of first metal fittings 70 are inserted into the through-holes of first circuit board 51. Then, leg pieces 75 are soldered to output terminal foil 56 of first circuit board 51 by passing first circuit board 51 through the automatic soldering bath along a conveyer. Even if first metal fittings 70 are subjected to the vibration of the conveyer or to the buoyancy force in the automatic soldering bath, first metal fittings 70 can be prevented from tilting or being uplifted because sides 73 and 74 in contact with first circuit board 51 are present on both sides of each leg piece 75.

Figure 9A:
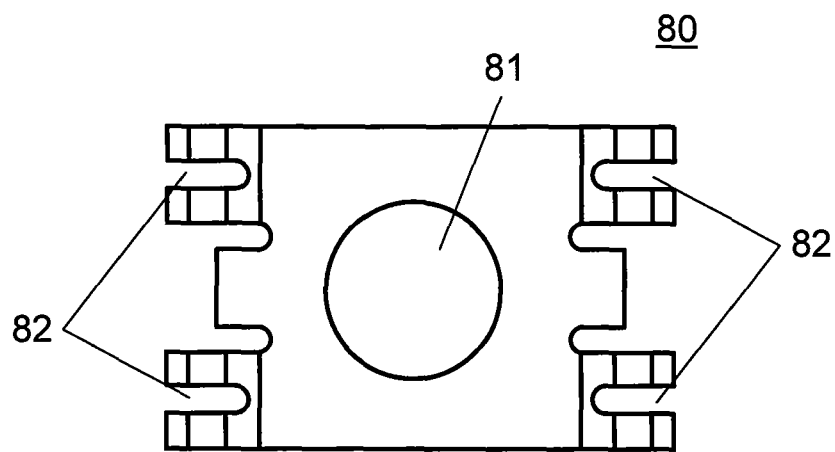
FIG. 9A is a plan view of a second metal fitting used in the plasma display device.
Figure 9B:
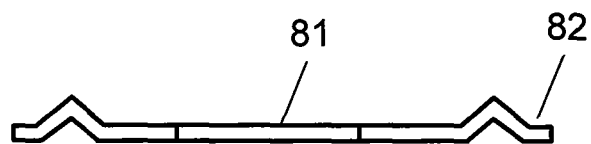
FIG. 9B is a front view of the second metal fitting.

FIGS. 9A and 9B are a plan view and a front view of second metal fittings 80 used in plasma display device 100. Second metal fittings 80 each include through-hole 81 for receiving a screw at the center of their flat metal plate. Second metal fittings 80 further each include connection pieces 82 bent upward at both ends thereof. Second metal fittings 80 are soldered at connection pieces 82 to second circuit boards 52 and 53.

Figure 10A:
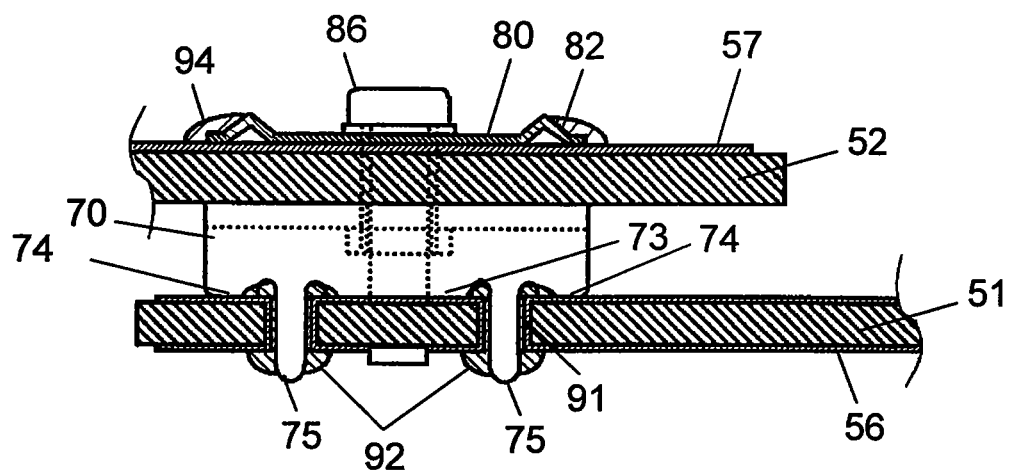
FIG. 10A is a sectional view showing the first circuit board and the second circuit boards connected to each other in the plasma display device.
Figure 10B:
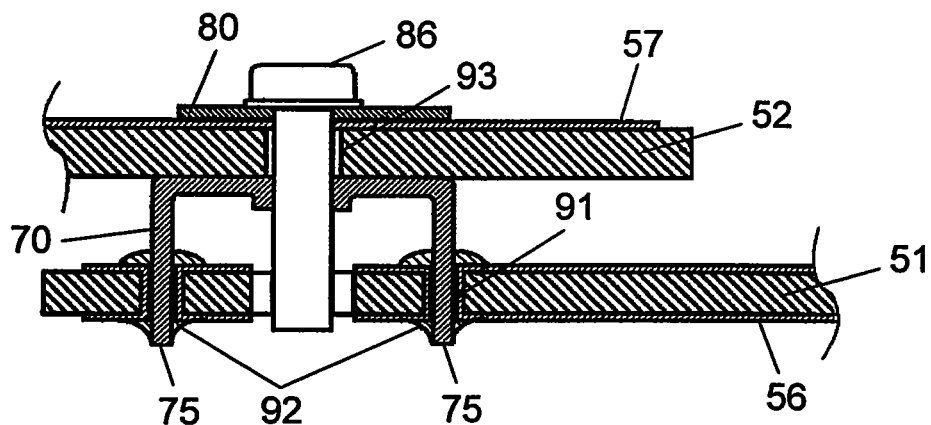
FIG. 10B is another sectional view showing the first circuit board and the second circuit boards connected to each other in the plasma display device.

FIGS. 10A and 10B are sectional views showing first circuit board 51 and second circuit board 52 connected to each other in the plasma display device of the embodiment. FIG. 10A is a sectional view seen from a direction parallel to the gutter of the U-shaped gutter of first metal fittings 70, and FIG. 10B is a sectional view seen from a direction perpendicular to the gutter of the U-shaped gutter of first metal fittings 70.

First metal fittings 70 are soldered by solder 92 to output terminal foil 56 after their four leg pieces 75 are inserted into through-holes 91 of first circuit board 51. Second metal fittings 80 are soldered by solder 94 to input terminal foil 57 of second circuit board 52 after through-holes 81 of second metal fittings 80 for receiving screws are aligned with through-holes 93 of second circuit board 52 for receiving the screws.

First and second circuit boards 51 and 52 are connected as follows. First, second circuit board 52 is laid over first circuit board 51. Then, screws 86 are inserted and screwed into screw holes 72 of first metal fittings 70 and through-holes 93 of second circuit board 52. Since the plurality of first metal fittings 70 are parallelly attached to first circuit board 51 as described above, second circuit boards 52 and 53 can be fixed to first circuit board 51 without contact failure.

Thus, in the embodiment, leg pieces 75 of first metal fittings 70, when made to pass through first circuit board 51, are arranged to have both sides thereof sides 73 and 74, which are opposite to top 71 and are in contact with first circuit board 51. This allows first metal fittings 70 to be properly attached to first circuit board 51, and second circuit boards 52 and 53 to be securely connected to first circuit board 51. The presence of the plurality of leg pieces 75 can maintain the posture of first metal fittings 70 and increase the connection strength.

Screws 86 are connected by surface contact to input terminal foil 57 on second circuit board 52 through second metal fittings 80. This ensures the connection between output terminal foil 56 of first circuit board 51 and input terminal foils 57 and 58 respectively of second circuit boards 52 and 53 by means of screws 86 and second metal fittings 80. In addition, the contact area is large enough to reduce the connection impedance, thereby reducing ringing, and hence, stabilizing the operation.

The use of the inexpensive iron components instead of expensive components such as gold-plated connectors leads to a cost reduction.

In the embodiment, scan electrode drive circuit 33 is divided into some parts and mounted on a plurality of circuit boards. However, the present invention can also be applied to the case where another electrode driver circuit such as sustain electrode drive circuit 34 is divided into some parts and mounted on a plurality of circuit boards.

The specific values shown in the embodiment are one example, and can be changed depending on the properties, specification, or the like of the panel.

INDUSTRIAL APPLICABILITY

The plasma display device of the present invention is useful as an image display device using a panel because it can provide the display electrode pairs with desired drive voltage waveforms so as to display high quality images even when the panel is large.

The invention claimed is:

1. A plasma display device comprising:
a plasma display panel including a plurality of discharge cells, each of the discharge cells having a scan electrode, a sustain electrode, and a data electrode; and
a scan electrode drive circuit for driving the scan electrodes in one field composed of a plurality of subfields, each of the subfields including:
an address period to perform an address operation in which the scan electrodes are applied with a scan pulse and the data electrodes are applied with an address pulse; and
a sustain period to apply the scan electrodes and the sustain electrodes alternately with a sustain pulse so as to enable the discharge cells that have performed the address operation in the address period to emit light, wherein
the scan electrode drive circuit is mounted at least on a first circuit board generating the sustain pulse and a second circuit board outputting the scan pulse to the scan electrodes;
a plurality of first metal fittings are disposed on a top surface of the first circuit board, each of the first metal fittings having a screw hole at a top of each of the first metal fittings, as an output terminal;
a plurality of second metal fittings are disposed on a top surface of the second circuit board, each of the second metal fittings having a through-hole as an input terminal;
the top of each of the first metal fittings and a back surface of the second circuit board are contacted with each other and the first circuit board and the second circuit board are connected with each other, by inserting a screw into the through-hole of each of the second metal fittings and the through-hole of the second circuit board and the screw hole of each of the first metal fittings, in the order of the through-hole of each of the second metal fittings, then the through hole of the second circuit board, then the screw hole of each of the first metal fittings; and
each of the first metal fittings has a form of a U-shaped gutter placed upside down to be shaped like a table, the form of a U-shaped gutter having end portions opposed to each other;
each of the first metal fittings includes:
the screw hole at a center of the top of each of the first metal fittings;
a plurality of leg pieces disposed on each side of both sides of each of the first metal fittings, each leg piece passing through the first circuit board; and
when each leg piece is disposed on the first circuit board to pass through the first circuit board, both side portions around each leg piece of each of the first metal fittings are in contact with the first circuit board.

2. The plasma display device of claim 1, wherein
the first circuit board includes an output terminal foil on a back surface of the first circuit board;
the second circuit board includes an input terminal foil on top of the second circuit board; and
the output terminal foil is connected to the input terminal foil through each second metal fitting, each screw, the top of each of the first metal fittings, and each leg piece of each of the first metal fittings.

3. The plasma display device of claim 2, wherein each of the second metal fittings includes a flat member which extends in opposite directions from said through hole, said flat member is on said input terminal foil.

4. The plasma display device of claim 1, wherein
each of the second metal fittings includes:
connection pieces bent upward at both ends thereof; and
each connection piece is soldered on top of the second circuit board.

5. The plasma display device of claim 4, wherein each of the second metal fittings includes a flat member which extends in opposite directions from said through hole, said flat member is on said second circuit board.

6. A plasma display device according to claim 1, wherein said plurality of leg pieces includes a first plurality of leg pieces disposed on one of the sides of each of the first metal fittings and a second plurality of leg pieces disposed on another of the sides of each of the first metal fittings.

7. A plasma display device comprising:
a plasma display panel including a plurality of discharge cells, each of the discharge cells having a scan electrode, a sustain electrode, and a data electrode; and
a scan electrode drive circuit for driving the scan electrodes in one field composed of a plurality of subfields, each of the subfields including:
an address period to perform an address operation in which the scan electrodes are applied with a scan pulse and the data electrodes are applied with an address pulse; and
a sustain period to apply the scan electrodes and the sustain electrodes alternately with a sustain pulse so as to enable the discharge cells that have performed the address operation in the address period to emit light, wherein
the scan electrode drive circuit is mounted at least on a first circuit board generating the sustain pulse and a second circuit board outputting the scan pulse to the scan electrodes;
a plurality of first metal fittings are disposed on a top surface of the first circuit board, each of the first metal fittings having a screw hole at a top of each of the first metal fittings, as an output terminal;

a plurality of second metal fittings are disposed on a top surface of the second circuit board, each of the second metal fittings having a through-hole, as an input terminal;

the top of each of the first metal fittings and a back surface of the second circuit board are contacted with each other and the first circuit board and the second circuit board are connected with each other, by inserting a screw into the through-hole of each of the second metal fittings and the through-hole of the second circuit board and the screw hole of each of the first metal fittings, in the order of the through-hole of each of the second metal fittings, then the through hole of the second circuit board, then the screw hole of each of the first metal fittings; and each of the first metal fittings has a form of a U-shaped gutter placed upside down, the form of a U-shaped gutter having both sides at the end portions opposed to each other, each of the first metal fittings includes:
- the screw hole disposed on a center of the top of each first metal fitting, and
- a plurality of leg pieces disposed on each side of the both sides of each of the first metal fittings, and each side of the both sides of each of the first metal fittings includes;
- one portion of each side of the both sides of each of the first metal fittings disposed between the one leg piece and the another leg piece among the plurality of leg pieces, and
- another portion of each side disposed except for between one leg piece and another leg piece among the plurality of leg pieces, and the plurality of leg pieces are disposed on the first circuit board to pass through the first circuit board, and one portion and another portion of each side of each of the first metal fittings are in contact with the first circuit board.

8. A plasma display device according to claim 7, wherein said plurality of leg pieces includes a first plurality of leg pieces disposed on one of the sides of each of the first metal fittings and a second plurality of leg pieces disposed on another of the sides of each of the first metal fittings.

\* \* \* \* \*